United States Patent
Konrath et al.

(10) Patent No.: US 9,859,362 B2
(45) Date of Patent: Jan. 2, 2018

(54) PROCESSING A SEMICONDUCTOR WAFER (71) Applicant: Infineon Technologies AG, Neubiberg (DE)

(72) Inventors: Jens Peter Konrath, Villach (AT); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/151,667

(22) Filed: May 11, 2016

(65) Prior Publication Data
US 2016/0336396 A1 Nov. 17, 2016

(30) Foreign Application Priority Data

May 12, 2015 (DE) .................. 10 2015 208 794

(51) Int. Cl.
*H01L 29/06* (2006.01)
*H01L 29/739* (2006.01)
(Continued)

(52) U.S. Cl.
CPC .... *H01L 29/0634* (2013.01); *H01L 21/02529* (2013.01); *H01L 21/046* (2013.01);
(Continued)

(58) Field of Classification Search
None
See application file for complete search history.

(56) References Cited

U.S. PATENT DOCUMENTS

2002/0014658 A1* 2/2002 Blanchard ............... H01L 22/26 257/330
2015/0270284 A1* 9/2015 Chou .................. H01L 27/1203 257/347

FOREIGN PATENT DOCUMENTS

DE 10 2006 030 257 A1 1/2008
JP 2006-352092 A 12/2006
(Continued)

OTHER PUBLICATIONS

Japanese Office Action re: patent application No. 2016-096187; reference No. 128415E (machine translation provided), dated Jul. 18, 2017.

*Primary Examiner* — Michelle Mandala
(74) *Attorney, Agent, or Firm* — Baker Botts L.L.P.

(57) ABSTRACT

A semiconductor wafer processing system for processing a semiconductor wafer is presented. The semiconductor wafer processing system comprises: a trench production apparatus configured to produce trenches in the semiconductor wafer, the trenches being arranged next to each other along a first lateral direction (X); a trench filling apparatus configured to epitaxially fill the trenches with a doped semiconductor material; and a controller operatively coupled to at least one of the trench production apparatus and the trench filling apparatus, wherein the controller is configured to control at least one of the trench production apparatus and the trench filling apparatus in dependence of a parameter, the parameter being indicative of at least one of a variation of dopant concentrations of the doped semiconductor material along the first lateral direction (X) that is to be expected when carrying out the epitaxially filling and a deviation of an expected average of the dopant concentrations from a predetermined nominal value.

17 Claims, 4 Drawing Sheets

(51) Int. Cl.
*H01L 29/861* (2006.01)
*H01L 21/02* (2006.01)
*H01L 21/04* (2006.01)
*H01L 21/308* (2006.01)
*H01L 21/67* (2006.01)
*H01L 21/66* (2006.01)
*H01L 29/10* (2006.01)
*H01L 29/16* (2006.01)
*H01L 29/66* (2006.01)
*H01L 29/78* (2006.01)

(52) U.S. Cl.
CPC ...... *H01L 21/0475* (2013.01); *H01L 21/3081* (2013.01); *H01L 21/3086* (2013.01); *H01L 21/67063* (2013.01); *H01L 22/20* (2013.01); *H01L 22/34* (2013.01); *H01L 29/0696* (2013.01); *H01L 29/1095* (2013.01); *H01L 29/1608* (2013.01); *H01L 29/739* (2013.01); *H01L 29/861* (2013.01); *H01L 22/14* (2013.01); *H01L 29/6606* (2013.01); *H01L 29/66068* (2013.01); *H01L 29/7395* (2013.01); *H01L 29/7811* (2013.01)

(56) References Cited

FOREIGN PATENT DOCUMENTS

| JP | 2007-251023 A | 9/2007 |
| JP | 2007-329385 A | 12/2007 |
| JP | 2010-040576 A | 2/2010 |
| JP | 2010-103260 A | 5/2010 |
| JP | 2011-054885 A | 3/2011 |
| JP | 2014-003191 A | 1/2014 |

* cited by examiner

PROCESSING A SEMICONDUCTOR WAFER

CROSS-REFERENCE TO RELATED APPLICATION

This application claims priority to German Application Serial No. 102015208794.8 filed May 12, 2015 and entitled "Processing a Semconductor Wafer."

TECHNICAL FIELD

This specification refers to embodiments of a method of processing a semiconductor wafer, embodiments of a semiconductor wafer processing system and to embodiments of a semiconductor wafer. In particular, this specification refers to embodiments of a semiconductor wafer based on silicon carbide and to embodiments of a method and a system for processing such semiconductor wafer.

BACKGROUND

Many functions of modern devices in automotive, consumer and industrial applications, such as converting electrical energy and driving an electric motor or an electric machine, rely on semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

Such power supplies or, respectively, power converters shall usually exhibit a high degree of efficiency. To this end, semiconductor devices have been proposed that exhibit a so-called compensation structure, wherein such devices are also referred to as "superjunction" or "CoolMOS"™ devices. Such compensation structure may lead to a reduction of the on-state resistance of the semiconductor device.

SUMMARY

According to an embodiment, a method of processing a semiconductor wafer is presented. The method includes epitaxially filling of trenches of the semiconductor wafer with a doped semiconductor material, wherein the trenches are arranged next to each other along a first lateral direction. The method further comprises: Determining a parameter indicative of at least one of a variation of dopant concentrations of the doped semiconductor material along the first lateral direction that is to be expected when carrying out the epitaxially filling and a deviation of an expected average of the dopant concentrations from a predetermined nominal value; and carrying out at least one subsequent processing step in dependence of the parameter.

According to a further embodiment, a semiconductor wafer processing system for processing a semiconductor wafer is presented. The system comprises: a trench production apparatus configured to produce trenches in the semiconductor wafer, the trenches being arranged next to each other along a first lateral direction; a trench filling apparatus configured to epitaxially fill the trenches with a doped semiconductor material; and a controller operatively coupled to at least one of the trench production apparatus and the trench filling apparatus, wherein the controller is configured to control at least one of the trench production apparatus and the trench filling apparatus in dependence of a parameter, the parameter being indicative of at least one of a variation of dopant concentrations of the doped semiconductor material along the first lateral direction that is to be expected when carrying out the epitaxially filling and a deviation of an expected average of the dopant concentrations from a predetermined nominal value.

According to another embodiment, a semiconductor wafer comprising an active region and a wafer edge region surrounding the active region is presented. The active region includes a number of transistor cells being configured to carry a load current by means of a semiconductor drift region arranged within the active region. The semiconductor wafer further comprises: trenches extending into the semiconductor drift region along a vertical extension direction, the trenches being arranged next to each other along a first lateral direction and being filled with a doped semiconductor material, the doped semiconductor material exhibiting a band gap greater than the band gap of silicon, wherein, for each pair of adjacent trenches, a volume integral of the dopant concentration of the doped semiconductor material filled in a first trench of the pair deviates from a corresponding volume integral of the dopant concentration of the doped semiconductor material filled in a second trench of the pair by no more than 10%.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings.

DETAILED DESCRIPTION

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor region. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, the extension direction Z mentioned below may be a vertical direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped. Further, within this specification, the term "dopant concentration" may refer to an integral dopant concentration or, respectively, to a mean dopant concentration or to a sheet charge carrier concentration of a specific semiconductor region or semiconductor zone, such as a semiconductor region within a trench. Thus, e.g., a statement saying that a specific semiconductor region exhibits a certain dopant concentration that is higher or lower as compared to a dopant concentration of another semiconductor region may indicate that the respective mean dopant concentrations of the semiconductor regions differ from each other.

In the context of the present specification, the terms "in Ohmic contact", "in electric contact", "in Ohmic connection", and "electrically connected" intend to describe that there is a low Ohmic electric connection or low Ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

Specific embodiments described in this specification pertain to, without being limited thereto, a semiconductor wafer including a number of power semiconductor devices, e.g., monolithically integrated diode or transistor cells, such as monolithically integrated IGBT cells, monolithically integrated MOS Gated Diode (MGD) cells, or monolithically integrated MOSFET cells and/or derivatives thereof that may be used within a power converter or a power supply.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 30 V, more typically 100 V, or even more than 600 V, and above.

Figure 1:
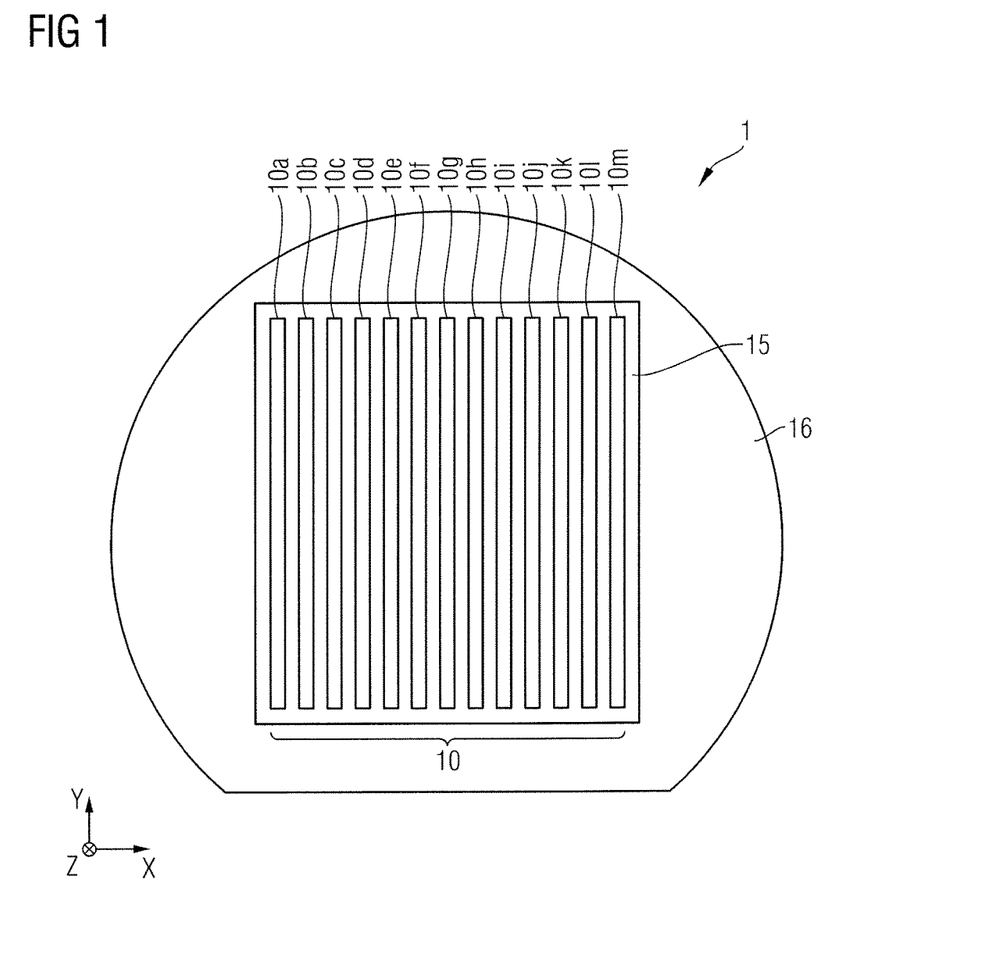
FIG. 1 schematically illustrates a section of a horizontal projection of a semiconductor wafer according to one or more embodiments.

FIG. 1 schematically illustrates a section of a horizontal projection of a semiconductor wafer 1 according to one or more embodiments. FIG. 2C schematically and exemplary illustrates a section of a vertical cross-section of the semiconductor device 1 in accordance with one or more embodiments. In the following, reference will be made to both FIG. 1 and FIG. 2C.

For example, the semiconductor wafer 1 exhibits a diameter of some millimeters, such as a diameter of 100 mm, of 150 mm, of 200 mm, of 300 mm or of 450 mm or of more than 450 mm. The semiconductor wafer 1 may comprise an active region 15 and a wafer edge region 16 that surrounds the active region 15 and that may be a non-active region.

For example, the active region 15 includes a number of transistor cells (not illustrated in the figures) that are configured to carry a load current by means of a semiconductor drift region 13 of the semiconductor wafer 1. The semiconductor drift region 13 can be arranged within the active region 15 and may exhibit a total extension along a vertical extension direction, i.e., a depth of at least 5 µm. For example, the wafer edge region 16 does not include any transistor cells that are configured to carry a load current. Each of the transistor cells may comprise at least one gate electrode, which can be, e.g., realized as a trench gate electrode extending into the semiconductor drift region 13 or, respectively, as a planar gate electrode being arranged above the semiconductor drift region 13.

The semiconductor wafer 1 further comprises a number of trenches 10 that extend into the semiconductor drift region 13 along the vertical extension direction Z. In FIG. 1, thirteen trenches 10a to 10m are schematically illustrated by way of example. It goes without saying that the semiconductor wafer 1 may certainly comprise more or less than thirteen trenches. For example, the semiconductor wafer comprises at least $10^5$ trenches 10. In FIG. 2C, only five of such trenches 10a to 10e are schematically illustrated. The trenches 10 can be arranged next to each other along a first lateral direction X and can each be filled with a doped semiconductor material 11.

For example, the trenches 10 each exhibit the same total extension along the vertical extension direction Z. In other words, the trenches 10 may all exhibit the same trench depth. For example, the trench depths are each within the range of 0.2 µm to For example, the trench depths (i.e., the total extensions along the vertical extension directions) are each within the range of 1 µm to 10 µm. Further, the trenches 10 may each exhibit the same total extension along the second lateral direction Y. In other words, the trenches 10 may all exhibit the same trench length. The distance (also referred to as "pitch") along the first lateral direction X between every two adjacent trenches of the trenches 10 may amount to less than 10 µm, to less than 3 µm or even to less than 1 µm.

The doped semiconductor material 11 may exhibit a band gap greater than the band gap of silicon. For example, the doped semiconductor material 11 is doped silicon carbide (SiC). Further, the band gap of the doped semiconductor material 11 can amount to at least 2 eV.

In an embodiment, the semiconductor drift region 13 is made of a semiconductor material comprising dopants of the first conductivity type, and the doped semiconductor material 11 comprises dopants of the second conductivity type. For example, the semiconductor drift region 13 is an n-doped region and the semiconductor material 11 is p-doped. For example, the dopant concentration of the semiconductor drift region 13 is greater than $10^{13}/cm^3$, and the dopant concentration of the doped semiconductor material 11 filled within each of the trenches 10 is greater than $10^{15}/cm^3$. In an embodiment, the dopant concentration of the doped semiconductor material 11, which can be p-doped, is at least twice as large as the dopant concentration of the semiconductor drift region 13, which can be n-doped. For example, the latter relations of the dopant types and the dopant concentrations may be appropriate in the event that the doped semiconductor material 11 filled into the trenches 10 is used for compensation purposes (compensation trenches), e.g., for forming a superjunction structure.

Further, the doped semiconductor material 11 may be in contact with the semiconductor drift region 13.

For example, also the semiconductor drift region 13 can be made of a semiconductor material that exhibits a band gap greater than the band gap of silicon. For example, the semiconductor drift region 13 is made of doped silicon carbide (SiC).

In an embodiment, each of the transistor cells of the semiconductor wafer 1 may exhibit a compensation structure (also referred to as "superjunction" structure) formed at least by means of the trenches 10 filled with a doped semiconductor material 11. In other words, the trenches 10 may form a compensation structure for compensating for the dopants of the semiconductor drift region 13.

Further, for each pair of adjacent trenches, such as trenches 10a and 10b, or trenches 10b and 10c, or trenches 10l and 10m and so on, a volume integral of the dopant concentration of the doped semiconductor material 11 filled in a first trench of the respective pair deviates from a corresponding volume integral of the dopant concentration of the doped semiconductor material 11 filled in a second trench of the pair by no more than 10%. In an embodiment, the variation can be even smaller than 10%, such as 8%, smaller than 6%, or even smaller than 6%, such as 4%. This variation may even be smaller than 3%, or even smaller than 2%.

For example, a volume integral of the dopant concentration of the doped semiconductor material 11 filled in any one of the trenches does not deviate by more than 10% from an average value of the volume integrals of the dopant concentration of the doped semiconductor material filled in each of the trenches 10. In an embodiment, the deviation can be even smaller than 10%, such as 8%, smaller than 6%, or even smaller than 6%, such as 4%. Due to this low variation between the volume integrals, the transistor cells of the semiconductor wafer 1 may exhibit a comparatively homogeneous blocking voltage.

Figure 4:
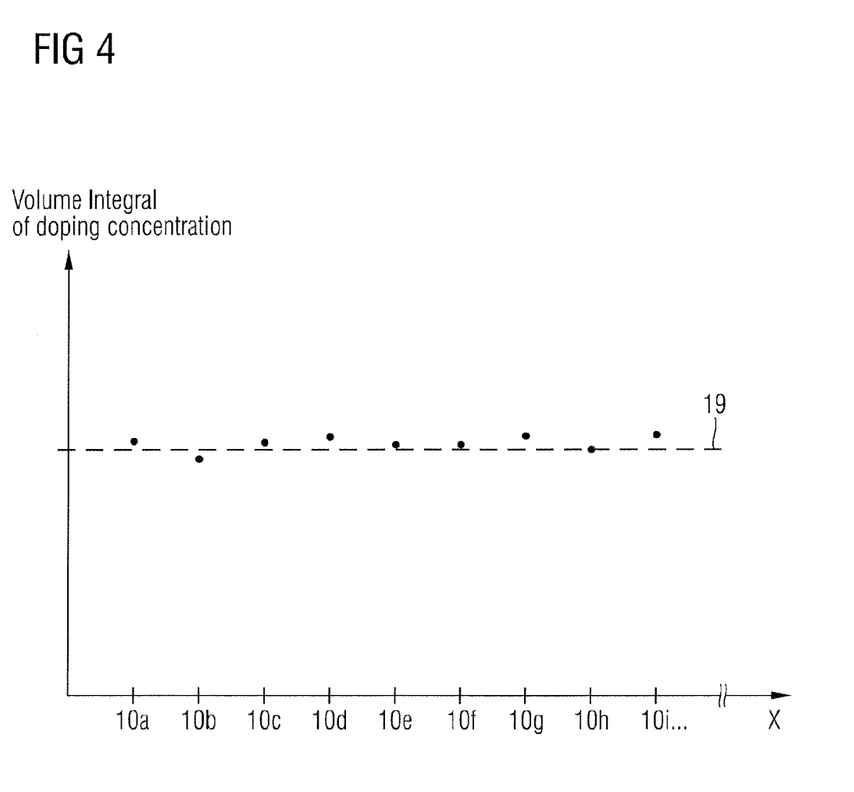
FIG. 4 schematically illustrates an exemplary distribution of volume integrals of dopant concentrations according to one or more embodiments.

For example, the volume integral is determined along the entire width of each trench in the first lateral direction X, along the entire length in the second lateral direction Y and along the entire depth in the vertical extension direction Z. Thus, the variation of the volume integrals can be determined along the first lateral direction X. An exemplary distribution of the volume integrals is schematically illustrated by FIG. 4. Accordingly, in an example, the volume integral of the dopant concentration of trench 10a may be slightly above the average dopant concentration illustrated by the dashed line 19. The volume integral of the dopant concentration of trench 10b may be slightly below the average 19 and so on. For example, the variation the volume integrals between the respective trenches 10 along the first lateral direction X may be expressed by a scalar function.

In the following, embodiments of a method of processing a semiconductor wafer and embodiments of a semiconductor wafer processing system will be described. For example, according to an embodiment, the semiconductor wafer 1 described above with respect to FIG. 1 and FIG. 2C can be produced by means of the method or by means of the semiconductor wafer processing system.

Figure 2A:
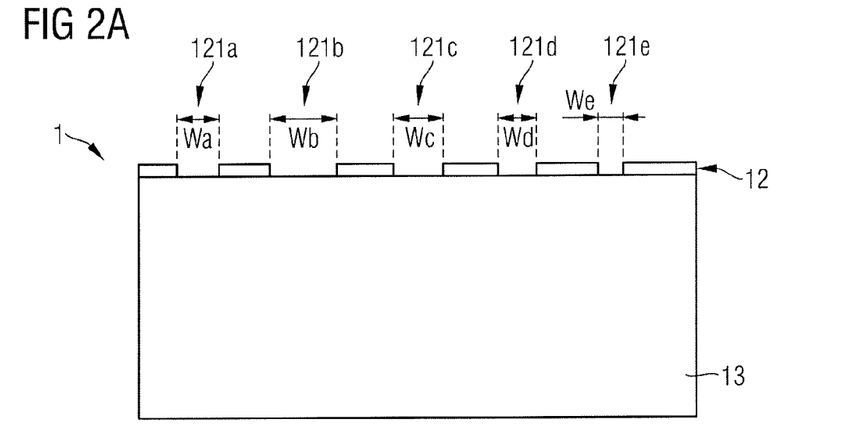
FIG. 2A-C schematically illustrate sections of a vertical cross-section of a semiconductor wafer during some steps of a method of processing such semiconductor wafer according to one or more embodiments.
Figure 2B:
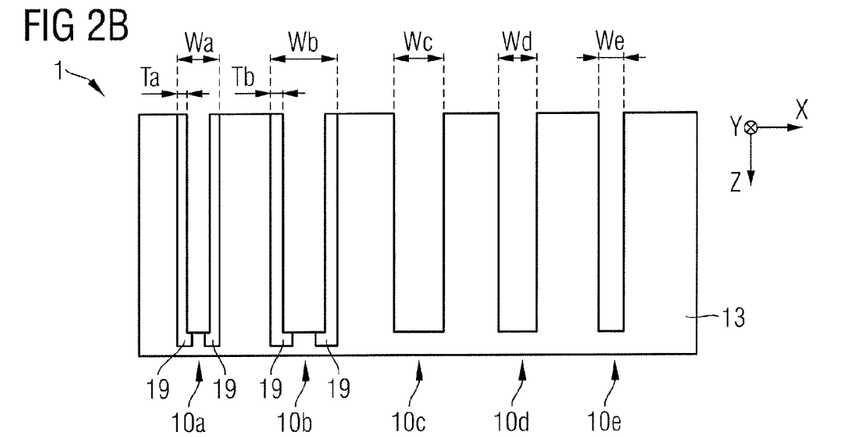
Figure 2C:
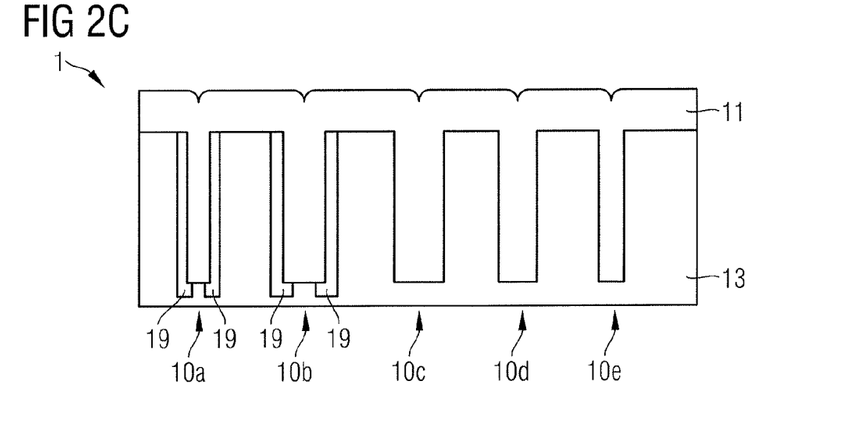
Figure 3:
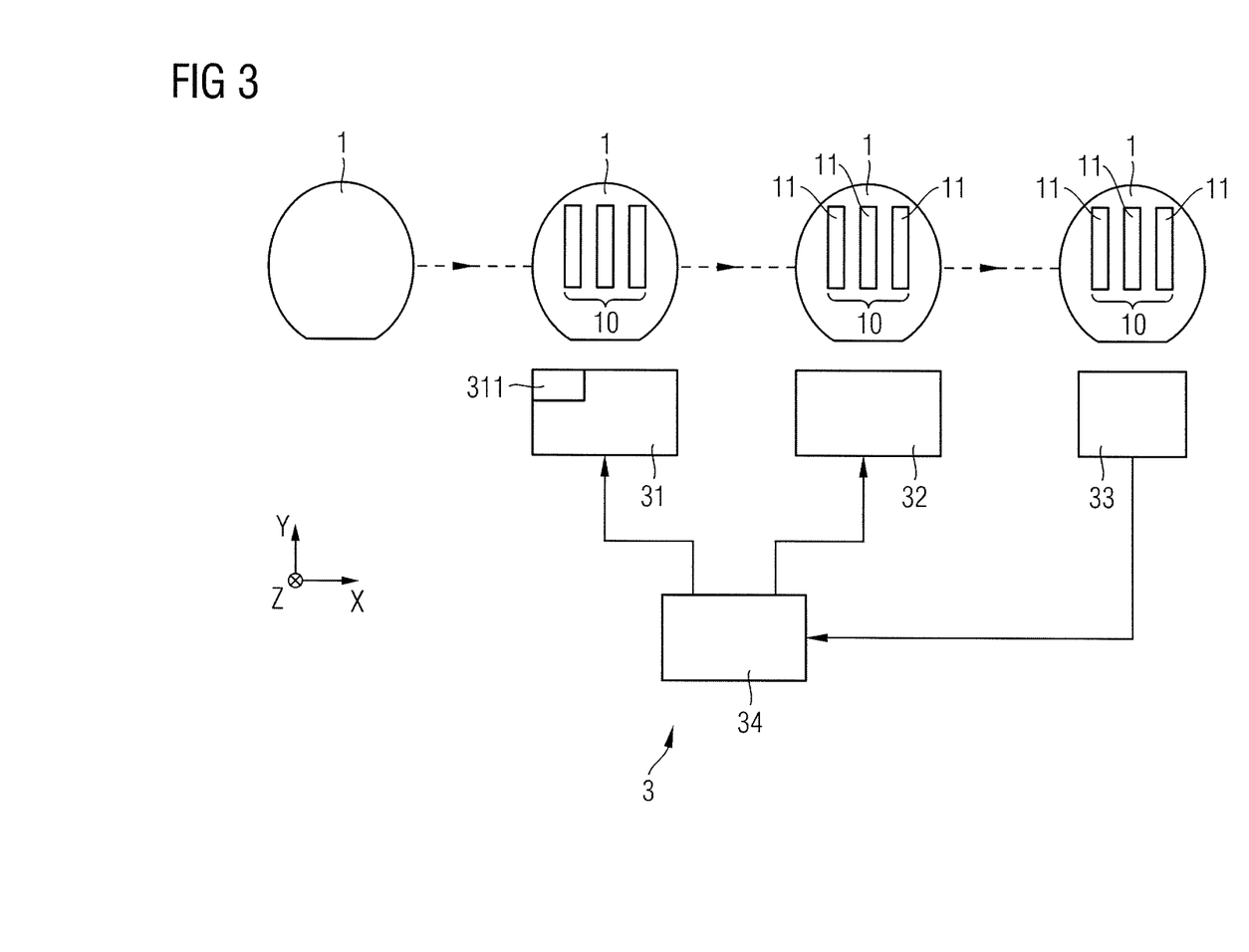
FIG. 3 schematically illustrates a block diagram of components of a semiconductor wafer processing system according to one or more embodiments.

FIG. 2A-C schematically illustrate sections of vertical cross-sections of a semiconductor wafer 1 during some steps of a method of processing such semiconductor wafer 1 according to one or more embodiments. FIG. 3 schematically illustrates a block diagram of components of a semiconductor wafer processing system 3 according to one or more embodiments. In the following, it will be referred to both FIG. 2A-C and to FIG. 3.

For example, the method of processing the semiconductor wafer 1 may include producing trenches 10 in the semiconductor wafer 1, wherein the trenches 10 can be arranged next to each other along the first lateral direction X. Each trench may further extend along the second lateral direction Y and into the semiconductor wafer 1 along the vertical extension direction Z. For example, such trench production can be carried out by a trench production apparatus 31 (cf. FIG. 3) of the semiconductor wafer processing system 3.

For example, the trenches 10 are produced such that all trenches 10 exhibit the same total extension along the vertical extension direction Z. In other words, the trenches 10 may all exhibit approximately the same trench depth. Further, the trenches 10 may each exhibit approximately the same total extension along the second lateral direction Y. In other words, the trenches 10 may all exhibit approximately the same trench length. The distance (also referred to as "pitch") along the first lateral direction X between every two adjacent trenches of the trenches 10 may amount to less than 10 μm, to less than 3 μm or even to less than 1 μm.

The method of processing the semiconductor wafer may further include epitaxially filling the trenches 10 of the semiconductor wafer 1 with a doped semiconductor material 11. For example, epitaxially filling the trenches 10 with the doped semiconductor material can be carried out by a trench filling apparatus 32 of the semiconductor wafer processing system 3. As already explained above, the doped semiconductor material 11 may exhibit a band gap greater than the band gap of silicon, for example a band gap greater than 2 eV. For example, the doped semiconductor material 11 is doped silicon carbide (SiC).

The method of processing the semiconductor wafer 1 may further comprise the step of determining a parameter that is indicative of at least one of a variation of dopant concentrations of the semiconductor material 11 along the first lateral direction X that is to be expected when carrying out the epitaxially filling and a deviation of an expected average of the dopant concentrations from a predetermined nominal value.

Thus, the parameter may express an expected variation of the dopant concentrations along the first lateral direction X. For example, as already explained with respect to FIG. 4, such parameter may include a scalar function that expresses the expected variation of dopant concentrations between the respective trenches 10 along at least the first lateral direction X. Or, the parameter may simply express that the expected average dopant concentration is above or below the predetermined nominal value, e.g., by a factor of 15% or more than 15%.

In an embodiment, the expected average dopant concentration is the expected average over all trenches 10 or over at least some of the trenches 10, such as every second of the trenches 10. The predetermined nominal value can be, e.g., a desired value of the dopant concentration that shall be present within each of the trenches 10.

For example, determining the parameter may include operating the semiconductor wafer processing system 3 as follows: In a first step, the trench production apparatus 31 of the system 3 produces trenches within at least one test wafer (not illustrated) and the trench filling apparatus 32 epitaxially fills the trenches of the at least one test wafer with the doped semiconductor material 11. In a next step, a dopant concentration of the doped semiconductor material 11 in at least two of the trenches of the at least one test wafer is determined. Such determining of the dopant concentration may comprise a corresponding measuring step and/or a corresponding sampling step, wherein different sampling techniques may be applied, such as static sampling, adaptive sampling, and/or dynamic sampling. The type of sampling may further vary depending on the direction (X, Y or Z direction). Further, it shall be understood that, in accordance with an embodiment, a dopant concentration of the doped semiconductor material 11 can also be measured in each of the trenches of the at least one test wafer and/or in at least some trenches of at least two test wafers and so on. After the dopant concentration of the doped semiconductor material 11 has been determined, the parameter can be calculated in dependence of the determined dopant concentrations.

After the at least one test wafer has been processed, subsequent processing steps for processing the semiconductor wafer 1 can be carried out by means of the semiconductor wafer processing system 3. For example, the parameter is determined before carrying out the step of epitaxially filling the trenches 10 of the semiconductor wafer 1, or even before the trenches 10 are produced within the semiconductor wafer 1.

In accordance with an embodiment, the at least one subsequent processing step is carried out in dependence of the determined parameter. For example, the semiconductor wafer processing system 3 further comprises a controller 34 that is operatively coupled to at least one of the trench production apparatus 31 and the trench filling apparatus 32. The controller 34 may be configured to control at least one of the trench production apparatus 31 and the trench filling apparatus 32 in dependence of the parameter. For example, the controller 34 implements a feed-forward-control based on that parameter for controlling at least one of the trench production apparatus 31 and the trench filling apparatus 32.

For example, in order to determine the parameter, the semiconductor wafer processing system 3 may comprise a determination unit 33 that is configured to determine the dopant concentration of the doped semiconductor material 11 within at least the two of the trenches 10. The controller 34 may be operatively coupled to the determination unit 33 and may be configured to calculate the parameter in dependence of the determined dopant concentrations. For example, the determination unit 33 may be configured to measure a dopant concentration within the trenches of the semiconductor wafer 1 or, respectively, of the semiconductor test wafer mentioned above. Further, the determination unit 33 may be configured to carry out the sampling, i.e., a static sampling, an adaptive sampling and/or dynamic sampling in order to determine the dopant concentrations such that the parameter can be calculated. In an embodiment, the determination unit 33 is configured to determine the dopant concentration by carrying out a capacitance-voltage-measurement (C-V-measurement). For example, such capacitance-voltage-measurement can be implemented at or along a sawing street (also referred to as "dicing line" or "dicing street" or "curf"; not illustrated) of the semiconductor wafer. Alternatively or additionally, the determination unit 33 may comprise a mercury prober (not illustrated) for measuring the dopant concentration. For example, the latter kind of measurement can be implemented within the active region 15 of the semiconductor wafer. Further, the determination unit 33 may be configured for being arranged within a semiconductor wafer test field, e.g., at a position of a semiconductor wafer production facility. The measurement of the dopant concentration by the determination unit 33 can be implemented before the semiconductor wafer is cut. As explained above, the active region 15 may include a number of transistor cells (not illustrated in the figures) that are configured to carry a load current by means of the semiconductor drift region 13 of the semiconductor wafer. Each of the transistor cells may comprise at least one gate electrode, which can be, e.g., realized as a trench gate electrode extending into the semiconductor drift region 13 or, respectively, as a planar gate electrode being arranged above the semiconductor drift region 13. Thus, the measurements to be carried out by the determination unit 33 can be applied to at least one of a semiconductor wafer exhibiting a planar gate structure and a semiconductor wafer exhibiting a trench gate structure.

In accordance with an embodiment, the step of epitaxially filling the trenches 10 with the doped semiconductor material 11 is carried out at a processing temperature greater than 1400° C. Such processing temperature can be adequate for semiconductor materials exhibiting a band gap greater than the band gap of silicon. For example, the processing temperature can be greater than 1500° C., or greater than 1700° C.

In the following, some examples of subsequent processing steps shall be described.

In accordance with an embodiment, the method may comprise providing a plurality of masks (not illustrated), wherein each mask exhibits a unique trench width design. That is to say: The trench width designs of the plurality of masks each differ from each other. For example, a first of the plurality of masks exhibits a trench width design that defines a width of 3.5 µm for each trench along the first lateral direction X. A second of the plurality of masks may exhibit a trench width design that defines a trench width along the first lateral direction X of 1 µm. Further, another trench of the plurality of masks may exhibit a trench width design, wherein the width of the trenches may differ along the first lateral direction X. The at least one subsequent processing step may further comprise: Choosing one of the plurality of masks in dependence of the determined parameter and producing the trenches 10 and the semiconductor wafer 1 by using the chosen mask. For example, the mask that has been chosen in dependence of the determined parameter may exhibit such a trench width design that compensates for the expected variation of the dopant concentrations so as to reduce the variation and so as to achieve a more homogeneous distribution of the dopant concentration along the first lateral direction X. In an embodiment, the trench production apparatus 31 may be configured to store such plurality of masks within corresponding storage means (not illustrated). The controller 34 may be configured for controlling the trench production apparatus 31 such that trench production apparatus 31 chooses one of the plurality of masks in dependence of the parameter and uses the chosen mask for carrying out the trench production step.

In accordance with another embodiment, the method may include depositing a hard mask material on the semiconductor wafer 1 for producing a hard mask 12. Such hard mask 12 is schematically and exemplary illustrated in FIG. 2A. In a next step, the hard mask 12 may be structured, wherein the structuring may include creating openings 121a to 121e in the hard mask 12, and wherein the openings 121a to 121e may be arranged next to each other along the first lateral direction X and exhibit a respective width Wa, . . . , We. For example, the structuring is carried out such that the widths Wa to We differ from each other in dependence of the determined parameter. For example, the variation of the widths Wa to We is such that the volume integral of the dopant concentration of the doped semiconductor material 11 to be filled within the trenches 10 varies less than predicted by the parameter. In an embodiment, the trench production apparatus 31 is configured to carry out such depositing and such structuring.

For example, the widths Wa to We are in each within the range of 0.5 µm to 5 µm.

In a next step, the trenches 10 may be created underneath the openings 121a to 121e. Thus, in accordance with the embodiment described above, the parameter that expresses the expected variation may influence the step of producing the trenches 10. As already indicated above, the step of producing the trenches 10, including, e.g., the step of depositing the hard mask material and the step of structuring of the hard mask, can be carried out by means of the trench production apparatus 31 of the system 3. After the trenches 10 have been produced in dependence of the parameter, the trenches 10 may be epitaxially filled with the doped semiconductor material 11, wherein the latter step can be carried out, e.g., by means of the filling apparatus 32 of the system 3.

In accordance with an embodiment, the structuring of the hard mask 12 may include controlling a wet etch process in dependence of the determined parameter. For example, the trench production apparatus 31 is configured to carry out such wet etch process and the controller 34 can be configured to control the trench production apparatus 31, such as the implementation of the wet etch process, in dependence of the determined parameter.

In accordance with another embodiment, the step of structuring the mask 12 may include controlling an exposure focus of an exposure unit in dependence of the parameter. For example, the trench production apparatus 31 of the semiconductor wafer processing system 3 may comprise such exposure unit, which is schematically illustrated in FIG. 3 and identified with reference sign 311. For example, the exposure unit 311 is configured to be set selectively in one of an out-of-focus-mode and an in-focus-mode. If the exposure unit 311 is in the out-of-focus mode, the width of the hard mask 12, e.g., the width Wa, may be comparatively large, whereas, if the exposure unit 311 is in the in-focus mode, the width of an opening of the hard mask 12 can be comparatively small. Thus, by controlling an exposure focus of the exposure unit 311, it can be possible to structure a hard mask 12 such that the openings 121a to 121e of the hard mask 12 exhibit a respective width that differ from each other. The controlling of the exposure focus can be carried out in dependence of the parameter, e.g., such that the variation of the volume integral of the doped semiconductor material filled in the trenches 10 is reduced as compared to the predicted variation expressed by the parameter.

In accordance with a yet further embodiment, the at least one subsequent processing step of the method may comprise the step of creating the trenches 10 by carrying out an etch processing step, wherein the etch processing step can be controlled in dependence of the parameter. For example, the trench production apparatus 31 of the system 3 can be configured to carry out such etch processing step. The controller 34 can be configured to control the implementation of the etch processing step in dependence of the parameter. For example, a variation of the trench width Wa to We can be achieved by adapting one or more of trench etch parameters according to which the etch processing step is carried out. For example, a plasma power, a plasma density, a gas flow rate, and/or a gas composition are trench parameters that may be varied, in accordance with an embodiment, in dependence of the determined parameter indicative of the expected variation of the dopant concentration. For example, by adapting the at least one such trench etch parameters, a lateral variation from an isotropic to an anisotropic etch rate can be controlled. In an embodiment, a ratio between chemical (anisotropic) etch components and physical (isotropic) etch components is controlled by adapting gas parameters, e.g., by adapting at least one of a carrier gas (e.g., helium (He) and/or argon (Ar)), the ratio between reactive components (e.g., fluorocarbon (CF4), fluoroform (CFH3), nitrogen-fluorine (NF3), sulfur hexafluoride ($SF_6$), and/or oxygen ($O_2$)) and the carrier gas, and the gas pressure. Further, adapting these parameters may also allow for controlling the plasma density, e.g., the plasma density along a radial direction, i.e., in a direction substantially perpendicular to a plasma radiation direction.

In accordance with yet a further embodiment, the at least one subsequent processing step of the method may further comprise a partial filling of at least some of the trenches 10 with a substantially undoped semiconductor material 19 (cf. FIG. 2B). For example, the partial filling of at least some of the trenches 10 with the substantially undoped semiconductor material 19 is carried out by means of the trench filling apparatus 31 of the semiconductor wafer processing system 3. For example, a thickness Ta, Tb of the substantially undoped semiconductor material 19 within the at least some trenches 10a, 10b can be adjusted in dependence of the determined parameter. Such optional method step is schematically and exemplary illustrated in FIG. 2B. Accordingly, the thickness Ta, Tb of the substantially undoped semiconductor material 19 can be varied along the first lateral direction X. For example, the width Ta of the substantially undoped semiconductor material 19 that is partially filled in the trench 10a may be smaller than the thickness Tb of the substantially undoped semiconductor material 19 that is partially filled in the adjacent trench 10b. For example, by adjusting the thickness of the substantially undoped semiconductor material 19, the volume of the remaining interior region of the respective trenches 10a, 10b can be adjusted.

For example, the substantially undoped semiconductor material 19 comprises at least one of silicon (Si), polysilicon (poly-Si), a polytype of a semiconductor, such as 3C, 4H, 6H or 15R or another polytype of silicon carbide (SiC).

For example, the substantially undoped semiconductor material 19 is deposited in the at least some trenches 10a, 10b. When carrying out the step of partially filling the at least some trenches 10a, 10b with the substantially undoped semiconductor material 19, it can, in accordance with an embodiment, be ensured that not the entire interior surface of the trenches 10a and 10b is covered with the substantially undoped semiconductor material 19, but that openings remain, e.g., at a bottom regions of the trenches 10a, 10b.

Thereby, it can be ensured that the doped semiconductor material 11 that is epitaxially filled in the trenches 10 afterwards, is in contact with the semiconductor drift region 13 and not entirely isolated from the semiconductor drift region 13 by the substantially undoped semiconductor material 19, as it is schematically and exemplary illustrated in FIG. 2C.

In accordance with yet a further embodiment, the at least one subsequent processing step may comprise modifying, after epitaxially filling the trenches 10 with the doped semiconductor material 11, the dopant concentration of the doped semiconductor material 11 by carrying out an implantation processing step.

For example, the implantation processing step is controlled in dependence of the parameter. In an embodiment, the trench filling apparatus 32 of the semiconductor wafer processing system 3 can be configured for carrying out the implantation processing step, and the controller 34 can be configured to control implementation of the implantation processing step in dependence of the parameter. For example, the implantation processing step comprises implanting implantation ions at sidewalls of the trenches 10 and/or at the trench bottoms of the trenches 10. Depending on the type of the implantation ions, a degree of compensation can be adjusted both in the n-loaded region as well as in the p-loaded region. The implantation step can be carried out by means known in the art. Further, the implantation step may comprise a plasma doping (PLAD) and/or an etch-implant-etch sequence. For example, after the implantation step has been carried out, implantation ions being present at a trench bottom can be removed, e.g. by carrying out an anisotropic etch process step.

The embodiments schematically illustrated in FIG. 1 to FIG. 4 and described above include the recognition that some methods of epitaxially filling trenches can yield a lateral variation of the dopant concentration in the range of 10%. Further, the variation from wafer to wafer within a single lot can be even above 10%, and a variation from wafer lot to wafer lot can be even above 15%. There may be situations in which it is desirable to reduce such variation of the dopant concentrations. For example, a reduction of such lateral variation may be desirable for compensation semiconductor devices (also referred to as superjunction semiconductor devices or as CoolMOS™ semiconductor devices), such as SiC-based compensation semiconductor devices, in particular regarding the dopant concentration of a doped semiconductor material filled within compensation trenches of the semiconductor device. In accordance with embodiments described above, both the replicability as well as a lateral homogeneity of the dopant concentration of the doped semiconductor material filled within trenches of a semiconductor wafer can be increased. Further, in accordance with the embodiments described above, a blocking voltage of the semiconductor devices included in the semiconductor wafer can be increased with respect to the total vertical extension of the semiconductor devices.

Further, in accordance with the embodiments described above, a feed-forward-control may be implemented when processing a semiconductor wafer. Such feed-forward-control may include determining the parameter that is indicative of at least one of the variation of the dopant concentrations of the doped semiconductor material along the first lateral direction that is to be expected when carrying out the epitaxially filling and a deviation of an expected average of the dopant concentrations from a predetermined nominal value. For example, after this parameter has been determined, trenches are produced within a subsequent semiconductor wafer and the trenches are epitaxially filled with a doped semiconductor material, wherein at least one of the trench production and the epitaxially filling is controlled in dependence of the determined parameter so as to reduce the expected variation of the dopant concentrations.

As described above, a semiconductor wafer that has been processed in accordance with the principles described above can comprise a plurality of transistor cells, wherein each of the transistor cells may exhibit a compensation structure. The compensation structure can be formed at least by means of the trenches that have been produced within the semiconductor wafer, e.g., within a semiconductor drift zone. For example, the semiconductor drift region is a weekly doped semiconductor region, wherein a dopant concentration of the semiconductor drift region is compensated by means of the doped semiconductor material that has been filled into the produced trenches of the semiconductor wafer. It shall be understood that in between two adjacent trenches of the trenches 10, which have been mentioned above with respect to FIG. 1-4 and which may be configured to be employed for compensation purposes, there may also be arranged one or more other trenches, e.g., trenches that used for other purposes than compensation, such as control regarding turn-off and/or turn-on processes.

It shall be understood that the semiconductor wafer processing system 3 as exemplarily described with respect to FIG. 3 can be a distributed system that comprises a plurality of semiconductor wafer processing equipment components. For example, the trench production apparatus 31 may comprise means for producing the hard mask on the semiconductor wafer and/or means for choosing one of the plurality of pre-produced masks and for positioning a chosen mask on top of the semiconductor wafer. Further, the trench production apparatus 31 may comprise means for etching a trench within the semiconductor wafer, means for structuring a hard mask, e.g., by modifying an exposure focus of an exposure unit, means for carrying out an etch process, such as a wet etch process, a plasma etch process and/or further means for producing and modifying a trench that is known in the art. Accordingly, the trench filling apparatus 32 may also comprise a plurality of means for filling the trenches with a doped semiconductor material and/or for modifying a dopant concentration of the doped semiconductor material. For example, the trench filling apparatus 32 comprises an epitaxy equipment configured to carry out epitaxial processing steps, an implantation unit configured to carry out implantation processing steps and/or further means configured to fill the trenches with a doped semiconductor material and/or for modifying a dopant concentration of the doped semiconductor material that are known in the art. Correspondingly, the determination unit 33 can comprise means configured to carry out a measurement of a dopant concentration and/or configured to carry out sampling steps, such as static, adaptive and/or dynamic sampling steps in order to determine the dopant concentration within at least some of the produced trenches. The controller 34 may comprise a processor and data storage means operatively coupled to the processor and configured to store a code that can be executed by the processor. For example, the code may include instructions for controlling the trench production apparatus 31, for controlling the trench filling apparatus 32 and/or for controlling the determination unit 33. The controller 34 can be coupled to each of the trench production apparatus 31, the trench filling apparatus 32 and the determination unit 33. Such coupling can be implemented, e.g., by means of wireless and/or hard-wired interfaces. In an embodiment, the semiconductor processing system 3 is configured to automatically determine the parameter by means of the determination unit 33.

A possible application of the principles described above with respect to some embodiments can include the following: As soon as a lot of semiconductor wafers is prepared for trench etching, the parameter is determined, e.g., by controlling the determination unit 33 by means of the controller 34 after having previously processed at least one test wafer. As explained above, the parameter can be indicative of at least one of the variation of dopant concentrations of the doped semiconductor material along the first lateral direction X that is to be expected when carrying out the epitaxial filling and the deviation of an expected average of the dopant concentrations from a predetermined nominal value. After the parameter has been determined, the semiconductor wafer processing system 3 can be blocked for a while. The parameter can be used for adapting the subsequent processing step, e.g., for determining processing parameters of a plasma etch process to be carried out by the trench production apparatus 31. As soon as the subsequent processing step has been adapted in dependence of the parameter, blocking of the semiconductor wafer processing system 3 can be released and production and filling of the trenches within all semiconductor wafers of a semiconductor wafer lot can be implemented by carrying out the subsequent processing step, e.g., by means of the trench production apparatus 31 and the trench filling apparatus 32. For example, an implantation can be additionally carried out in order to compensate for a variation between a first semiconductor wafer lot and a second semiconductor wafer lot.

Features of further embodiments are defined in the dependent claims. The features of further embodiments and the features of the embodiments described above may be combined with each other for forming additional embodiments, as long as the features are not explicitly described as being alternative to each other.

In the above, embodiments pertaining to semiconductor wafers and to methods and systems for processing a semiconductor wafer were explained. For example, these semiconductor wafers are based on silicon (Si). Accordingly, a monocrystalline semiconductor region or layer, e.g., the semiconductor regions 13 and 10a to 10e of exemplary embodiments, can be a monocrystalline Si-region or Si-layer. In other embodiments, polycrystalline or amorphous silicon may be employed.

It should, however, be understood that the semiconductor regions 13 and 10a to 10e can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide $(Si_xC_{1-x})$ and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A method of processing a semiconductor wafer, including epitaxially filling of trenches of the semiconductor wafer with a doped semiconductor material, wherein the trenches are arranged next to each other along a first lateral direction, the method comprising:
determining an expected average of dopant concentrations of the doped semiconductor material of the trenches and a nominal value of dopant concentrations of the doped semiconductor material of the trenches;
determining a parameter indicative of at least one of a variation of dopant concentrations of the doped semiconductor material along the first lateral direction (X) that is to be expected when carrying out the epitaxially filling and a deviation of the expected average of the dopant concentrations from the nominal value; and
carrying out at least one processing step in dependence of the parameter.

2. The method of claim 1, wherein the doped semiconductor material exhibits a band gap greater than a band gap of silicon.

3. The method of claim 1, wherein the step of epitaxially filling the trenches is carried out at a processing temperature greater than 1400° C.

4. The method of claim 1, wherein the parameter includes a scalar function expressing the variation of dopant concentrations between the respective trenches along at least the first lateral direction.

5. The method of claim 1, wherein determining the parameter includes:
operating a semiconductor wafer processing system by producing, with a trench production apparatus of the system, trenches within at least one test wafer and by epitaxially filling, with a trench filling apparatus of the system, the trenches of the at least one test wafer with the doped semiconductor material;

determining a dopant concentration of the doped semiconductor material in at least two of the trenches of the at least one test wafer; and calculating the parameter in dependence of the dopant concentrations of the doped semiconductor material in at least two of the trenches of the at least one test wafer.

6. The method of claim 5, wherein the at least one processing step is carried out by means of the semiconductor wafer processing system for processing the semiconductor wafer after having processed the at least one test wafer.

7. The method of claim 1, including:
providing a plurality of masks, wherein each mask exhibits a trench width design that is different from the design of each other mask;
wherein the at least one processing step comprises:
choosing one of the plurality of masks in dependence of the parameter; and
producing the trenches in the semiconductor wafer by using the chosen mask.

8. The method of claim 1, wherein the at least one processing step comprises:
depositing a hard mask material on the semiconductor wafer for forming a hard mask;
structuring the hard mask, wherein the structuring includes creating openings in the hard mask, the openings being arranged next to each other along the first lateral direction and exhibiting a respective width that varies along the first lateral direction in dependence of the parameter; and
creating, underneath the openings, the trenches in the semiconductor wafer.

9. The method of claim 8, wherein structuring the hard mask includes controlling a wet etch process in dependence of the parameter.

10. The method of claim 8, wherein structuring the mask includes controlling an exposure focus of an exposure unit of a semiconductor wafer processing system in dependence of the parameter.

11. The method of claim 1, wherein the at least one processing step comprises creating the trenches by carrying out an etch processing step, wherein the etch processing step is controlled in dependence of the parameter.

12. The method of claim 1, wherein the at least one processing step comprises partially filling at least some of the trenches with a semiconductor material, wherein a thickness of the semiconductor material within the at least some trenches is adjusted in dependence of the parameter.

13. The method of claim 1, wherein the at least one processing step comprises:
modifying, after epitaxially filling the trenches with the doped semiconductor material, the dopant concentration of the doped semiconductor material by carrying out an implantation processing step, wherein the implantation processing step is controlled in dependence of the parameter.

14. A semiconductor wafer processing system for processing a semiconductor wafer, comprising:
a trench production apparatus configured to produce trenches in the semiconductor wafer, the trenches being arranged next to each other along a first lateral direction;
a trench filling apparatus configured to epitaxially fill the trenches with a doped semiconductor material; and
a controller operatively coupled to at least one of the trench production apparatus and the trench filling apparatus, wherein the controller is configured to control at least one of the trench production apparatus and the trench filling apparatus in dependence of a parameter, the parameter being indicative of at least one of a variation of dopant concentrations of the doped semiconductor material along the first lateral direction (X) that is to be expected when carrying out the epitaxially filling and a deviation of an expected average of the dopant concentrations from a nominal value.

15. The semiconductor wafer processing system of claim 14, wherein the controller is configured to implement a feed-forward-control based on the parameter for controlling at least one of the trench production apparatus and the trench filling apparatus.

16. The semiconductor wafer processing system of claim 14, further comprising a determination unit configured to determine a dopant concentration of the doped semiconductor material within at least two of the trenches, wherein the controller is operatively coupled to the determination unit and configured to calculate the parameter in dependence of the dopant concentration.

17. The semiconductor wafer processing system of claim 16, wherein the controller is configured to control the semiconductor wafer processing system such that the following processing steps are carried out:
with the trench production apparatus, producing trenches in at least one test wafer, the trenches being arranged next to each other along a first lateral direction;
with the trench filling apparatus, epitaxially filling the trenches of the at least one test wafer with a doped semiconductor material;
with the determination unit: determining a dopant concentration of the doped semiconductor material within at least two of the trenches of the at least one test wafer; and
processing the semiconductor wafer by controlling at least one of the trench production apparatus and the trench filling apparatus based on the parameter that has been calculated based on the dopant concentration of the doped semiconductor material that has been filled into the trenches of the at least one test wafer.

* * * * *